(12) United States Patent
Lim et al.

(10) Patent No.: US 7,659,162 B2
(45) Date of Patent: Feb. 9, 2010

(54) PHASE CHANGE MEMORY DEVICE AND METHOD OF MANUFACTURING THE SAME

(75) Inventors: Young-Soo Lim, Cheongju-si (KR); Yong-Sun Ko, Suwon-si (KR); Sung-Un Kwon, Jeonju-si (KR); Jae-Seung Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 25 days.

(21) Appl. No.: 12/285,531

(22) Filed: Oct. 8, 2008

(65) Prior Publication Data

US 2009/0090899 A1    Apr. 9, 2009

(30) Foreign Application Priority Data

Oct. 8, 2007    (KR) ...................... 10-2007-0100745

(51) Int. Cl.
*H01L 21/8242* (2006.01)
(52) U.S. Cl. ...................... 438/239; 438/243; 438/253; 438/396
(58) Field of Classification Search ................ 438/238, 438/239, 240, 243, 250, 386, 387, 393, 396
See application file for complete search history.

(56) References Cited

U.S. PATENT DOCUMENTS

| | | | |
|---|---|---|---|
| 6,507,061 B1 * | 1/2003 | Hudgens et al. | 257/295 |
| 6,908,812 B2 | 6/2005 | Lowrey | |
| 6,936,840 B2 | 8/2005 | Sun et al. | |
| 6,995,388 B2 | 2/2006 | Hwang et al. | |
| 7,105,396 B2 * | 9/2006 | Hwang et al. | 438/198 |
| 7,385,235 B2 * | 6/2008 | Lung | 257/246 |
| 7,417,245 B2 * | 8/2008 | Happ et al. | 257/2 |
| 7,471,555 B2 * | 12/2008 | Lung | 365/163 |
| 7,525,176 B2 * | 4/2009 | Breitwisch et al. | 257/536 |
| 2001/0049189 A1 | 12/2001 | Zahoric | |
| 2007/0170413 A1 | 7/2007 | Matsui et al. | |

FOREIGN PATENT DOCUMENTS

KR    10-2007-0009702 A    1/2007

\* cited by examiner

*Primary Examiner*—Kevin M Picardat
(74) *Attorney, Agent, or Firm*—Lee & Morse, P.C.

(57) ABSTRACT

A method of manufacturing a phase change memory device includes forming at least one active device on a substrate, forming a bottom electrode electrically connected to the at least one active device, forming a phase change material layer and a top electrode on the bottom electrode, forming a capping layer on an upper surface of the top electrode and on side surfaces of the top electrode and phase change material layer, removing a portion of the capping layer overlapping the upper surface of the top electrode to define capping layer sidewall portions, forming an interlayer insulation film on the capping layer sidewall portions and on the top electrode, removing a portion of the interlayer insulation film from the top electrode to form a contact hole through the interlayer insulation film, and forming a contact plug in the contact hole.

14 Claims, 15 Drawing Sheets

PHASE CHANGE MEMORY DEVICE AND METHOD OF MANUFACTURING THE SAME

BACKGROUND OF THE INVENTION

1. Field of the Invention

Embodiments relate to a semiconductor memory device and to a method of manufacturing the same. zMore particularly, embodiments relate to a phase change memory device and to a method of manufacturing the same by removing an upper portion of a capping layer on a phase change material layer before forming a contact hole through an insulation film on the phase change material layer.

2. Description of the Related Art

A semiconductor memory device may store data and may include volatile semiconductor memory devices, e.g., a Dynamic Random Access Memory (DRAM), a Static Random Access Memory (SRAM), and so forth, and nonvolatile semiconductor memory devices, e.g., a flash memory of NAND or NOR type based on an Electrically Erasable Programmable Read Only Memory (EEPROM).

The volatile semiconductor memory device may have fast input/output data operation, but the stored data may be lost by an interruption of power supply. Thus, the volatile semiconductor memory device may require a periodic refresh operation and a high charge storage capacity. For example, the DRAM may have a capacitor having a bottom electrode with an increased surface area to increase its capacitance. An electrode with an increased surface area, however, may reduce an integration degree of the DRAM.

The nonvolatile semiconductor memory device may maintain stored data even when power supply is interrupted, but data programming/erasing may require high operating voltage, as compared with power source voltage, for tunneling charges through a gate insulation layer. Thus, e.g., the flash memory device may require a boosting circuit for generating voltage necessary for the programming/erase operation. Use of a boosting circuit, however, may increase a design rule of the flash memory device.

Attempts have been made to make a semiconductor memory device capable of incorporating advantages of the volatile and nonvolatile memory devices, e.g., a semiconductor memory device having a high operational speed and a large capacity of memory storage. For example, a semiconductor memory device having a reduced power consumption and dominant data maintenance, e.g., Ferroelectric Random Access Memory (FRAM), Magnetic Random Access Memory (MRAM), Phase-change Random Access Memory (PRAM), nanofloating gate memory (NFGM), and so forth.

A PRAM may achieve a high integration with a low cost through a simplified structure and a high speed. Data storage in a PRAM may be obtained by using a resistance difference based on phase change of material from a crystalline state to an amorphous state, i.e., the phase change material may have a high specific resistance when at an amorphous state and a low specific resistance when at a crystalline state. Thus, logic information stored in a unit cell of the PRAM may be identified by sensing a difference of current amount flowing through the phase change material. The phase change may be controlled by adjusting an amount of heat applied to a phase change material, e.g., an amount of current and/or a length of time.

The conventional PRAM, however, may include a phase change material having a portion exposed to a contact hole formed subsequently. Such an exposure may cause defects to a contact plug formed in the contact hole due to fumes of the phase change material, thereby reducing reliability and production yield of the PRAM.

SUMMARY OF THE INVENTION

Embodiments are therefore directed to a phase change memory device and to a method of manufacturing the same, which substantially overcome one or more of the disadvantages of the related art.

It is therefore a feature of an embodiment to provide a phase change memory device having a capping layer structure capable of preventing exposure of the phase change material layer to a contact hole formed subsequently.

It is another feature of an embodiment to provide a method of manufacturing a phase change memory device having a capping layer structure capable of preventing exposure of the phase change material layer to a contact hole formed subsequently.

At least one of the above and other features and advantages of the present invention may be realized by providing a method of manufacturing a phase change memory device, including forming at least one active device on a substrate, forming a bottom electrode electrically connected to the at least one active device, forming a phase change material layer and a top electrode on the bottom electrode, the phase change material layer being between the top and bottom electrodes, forming a capping layer on an upper surface of the top electrode and on side surfaces of the top electrode and phase change material layer, removing a portion of the capping layer overlapping the upper surface of the top electrode to define capping layer sidewall portions, the capping layer sidewall portions being on side surfaces of the top electrode and phase change material layer, forming an interlayer insulation film on the capping layer sidewall portions and on the top electrode, removing a portion of the interlayer insulation film from the top electrode to form a contact hole through the interlayer insulation film, the contact hole exposing the upper surface of the top electrode, and forming a contact plug in the contact hole.

The method may further include forming a hard mask layer on the top electrode, such that the phase change material layer, the top electrode, and the hard mask layer are sequentially stacked on the bottom electrode, the hard mask layer being between the capping layer and the top electrode. Forming the interlayer insulation film on the top electrode may include forming the interlayer insulation film directly on the hard mask layer, a surface of contact between the interlayer insulation film and the hard mask layer overlapping the entire upper surface of the top electrode. The phase change material layer and the top electrode may be formed through a dry etching method using the hard mask layer as a mask. Removing the portion of the capping layer overlapping the upper surface of the top electrode may include forming the capping layer conformally on an entire surface of substrate including the hard mask layer, forming a dummy interlayer insulation film on an entire surface of the capping layer, planarizing the dummy interlayer insulation film to expose the portion of the capping layer overlapping the upper surface of the top electrode, and anisotropically removing the exposed portion of the capping layer to expose an upper surface of the hard mask layer. Planarizing the dummy interlayer insulation film may include using a chemical mechanical polishing (CMP).

Removing the portion of the interlayer insulation film from the top electrode may further include removing a portion of the hard mask layer, the portions of the interlayer insulation film and the hard mask layer being removed in a single step using a substantially same reactive gas. The hard mask layer and the interlayer insulation film may be formed of a substantially same material. The hard mask layer and the interlayer insulation film may be removed by using one or more of $CF_4$, $C_4F_6$ and $C_5F_8$. The capping layer may be formed of a silicon nitride or of a silicon oxynitride by a chemical vapor deposition (CVD) method. The capping layer may be removed by a dry etching method using $CH_2F_2$ gas as a source gas. The hard mask layer and the interlayer insulation film may be formed of a silicon oxide. Removing the portion of the capping layer overlapping the upper surface of the top electrode may include completely removing the portion of the capping layer overlapping the upper surface of the top electrode. Removing the portion of the capping layer overlapping the upper surface of the top electrode may be performed in a self-aligned manner.

At least one of the above and other features and advantages of the present invention may be realized by providing a phase change memory device, including at least one active device on a substrate, a bottom electrode electrically connected to the at least one active device, a phase change material layer, a top electrode, and a hard mask layer sequentially stacked on the bottom electrode, a capping layer on side surfaces of the top electrode and of the phase change material layer, an interlayer insulation film on the capping layer and on the top electrode, a contact hole through the interlayer insulation film and the hard mask layer, the contact hole exposing the upper surface of the top electrode, and a contact plug in the contact hole.

The hard mask layer and the interlayer insulation film may include a silicon oxide. The capping layer may include a silicon nitride or a silicon oxynitride. The hard mask layer may separate the capping layer from the upper surface of the top electrode. The hard mask layer may separate the capping layer from the contact plug. The capping layer may be only on side surfaces of the top electrode and phase change material layer.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION OF THE INVENTION

Figure 1:
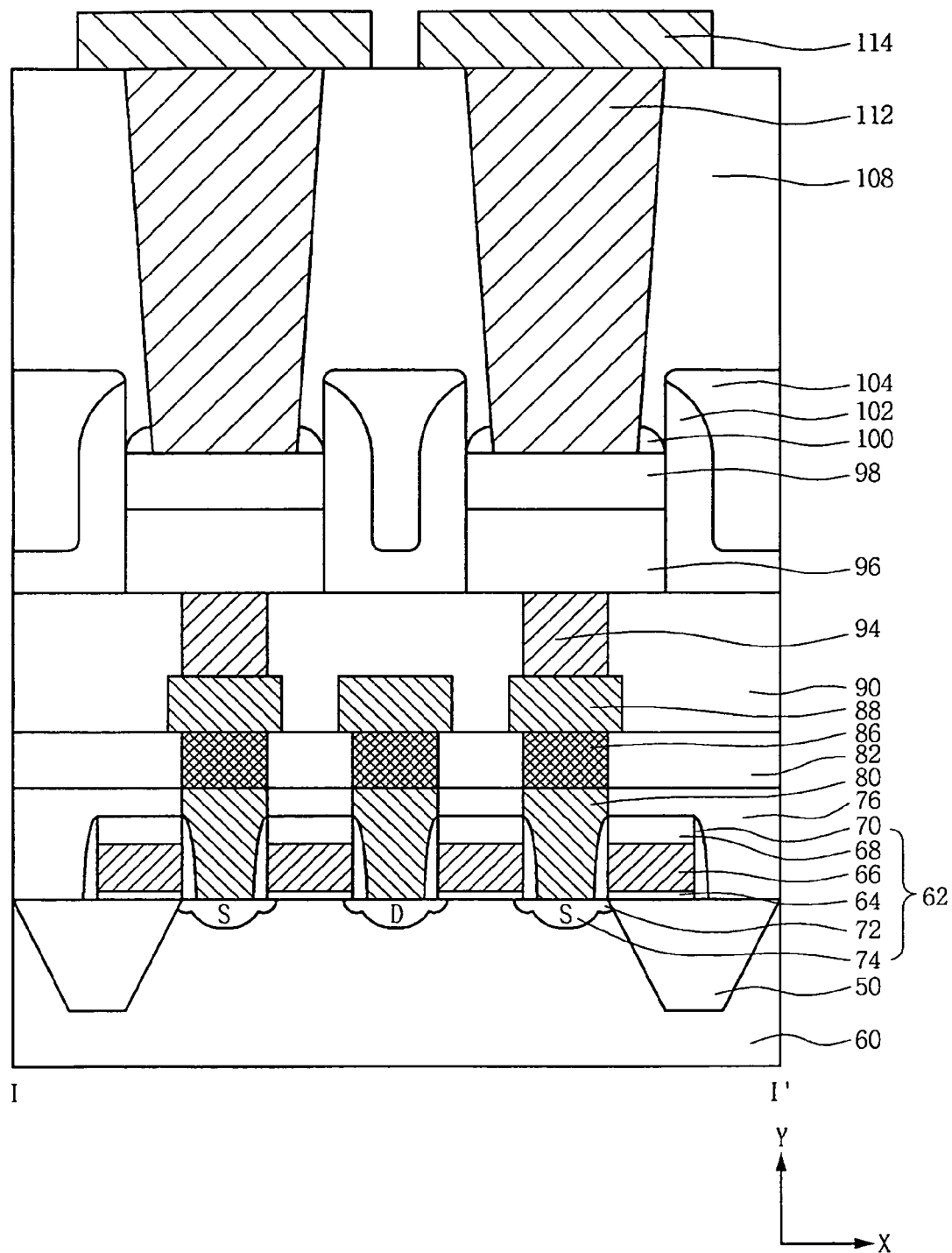
FIG. 1 illustrates a cross-sectional view of phase change memory device according to an example embodiment.

Korean Patent Application No. 10-2007-0100745, filed on Oct. 8, 2007, in the Korean Intellectual Property Office, and entitled: "Phase Change Memory Device and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements, layers, and regions may be exaggerated for clarity of illustration. It will also be understood that when an element and/or layer is referred to as being "on" another element, layer and/or substrate, it can be directly on the other element, layer, and/or substrate, or intervening elements and/or layers may also be present. Further, it will be understood that the term "on" can indicate solely a vertical arrangement of one element and/or layer with respect to another element and/or layer, and may not indicate a vertical orientation, e.g., a horizontal orientation. In addition, it will also be understood that when an element and/or layer is referred to as being "between" two elements and/or layers, it can be the only element and/or layer between the two elements and/or layers, or one or more intervening elements and/or layers may also be present. Further, it will be understood that when an element and/or layer is referred to as being "connected to" or "coupled to" another element and/or layer, it can be directly connected or coupled to the other element and/or layer, or intervening elements and/or layers may be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the terms "a" and "an" are open terms that may be used in conjunction with singular items or with plural items.

Unless otherwise defined, all terms used herein have the same meaning as commonly understood by one of ordinary skill in the art. It will be further understood that terms used herein should be interpreted as having a meaning that is consistent with their meaning in the context of this specification and the relevant art and will not be interpreted in an idealized or overly formal sense unless expressly so defined herein.

A phase change memory device, i.e., a PRAM, according to an example embodiment will be described in more detail below with reference to FIG. 1. FIG. 1 illustrates a cross-sectional view of a phase change memory device according to an embodiment.

Referring to FIG. 1, a phase change memory device may include at least one active device having an on/off operation through an electrical signal, e.g., an access transistor 62, on a semiconductor substrate 60 and a phase change material layer 96 with different resistance values according to current applied thereto via the access transistor 62.

For example, as illustrated in FIG. 1, the access transistor 62 may include a gate stack on the semiconductor substrate 60 of a crystal state, source/drain areas S/D at sides of the gate stack, and a channel region at a predetermined depth in the semiconductor substrate 60 under the gate stack. Accordingly, charges may move mutually between the source/drain areas S/D on both sides of the gate stack through the channel region in response to a signal applied to the gate stack. The gate stack may have a stacked structure of a gate insulation layer 64, a gate electrode 66, and a gate upper insulation layer 68 on an upper surface of the semiconductor substrate 60. The source/drain areas S/D may be individually coupled, i.e., electrically, to the phase change material layer 96 and to a bit line 88, e.g., via a bit line contact electrode 86, as will be described in more detail below. The bit line 88 and a word line may be crossed mutually while being electrically isolated from each other.

The phase change material layer 96 may be positioned above a source/drain area S/D of a respective access transistor 62 between bottom and top electrodes 94 and 98. For example, the bottom electrode 94, the phase change material layer 96, and the top electrode 98 may be sequentially formed on the bit line 88. The phase change material layer 96 may be electrically coupled to the bottom and top electrodes 94 and 98 having a relatively high resistance in upper and lower parts of the phase change material layer 96. A magnitude of the resistance may be controlled according to a state of a phase change material in the phase change material layer 96, i.e., crystalline or amorphous, thereby performing writing or reading logic data.

The phase change material layer 96 may include the phase change material. For example, the phase change material layer 96 may include at least one chalcogen, e.g., a compound including GeSbTe, having crystalline and amorphous structures of mutually different electrical characteristics that may be easily changed. The chalcogen in the phase change material layer 96 may generate joule heat proportionately to current applied thereto, e.g., by the bottom electrode 94, to trigger a phase change. Accordingly, the phase change material layer 96 may be heated by heat generated by the chalcogen or by the bottom electrode 94 to induce phase change of the phase change material in the phase change material layer 96. For example, joule heating may increase proportionately with respect to a specific resistance and area, so a contact area between the phase change material layer 96 and, e.g., the bottom electrode 94, may be adjusted to have a predetermined size capable of providing sufficient current. The bottom electrode 94 may be constructed of a preparation heating body to induce a phase change of the chalcogen in the phase change material layer 96.

As illustrated in FIG. 1, the phase change memory device may further include capping layer sidewall portions 102 on side surfaces of the phase change material layer 96, e.g., directly on side surfaces of the phase change material layer 96. For example, the capping layer sidewall portions 102 may not contact the upper surface of the top electrode 98 on an upper surface of a hard mask 100 thereon, as will be described in more detail below. The capping layer sidewall portions 102 may extend from a lower surface of the phase change material layer 96 in an upward direction, i.e., toward an upper surface of the phase change material layer 96, on the side surfaces of the phase change material layer 96 and on side surfaces of the top electrode 98. For example, the capping layer sidewall portions 102 may surround side surfaces of the phase change material layer 96 and the top electrode 98, e.g., surround entire side surfaces of the phase change material layer 96 and the top electrode 98. An uppermost surface of the capping layer sidewall portions 102 may be higher, i.e., further from the lower surface of the phase change material layer 96, than an upper surface of the top electrode 98. It is noted that "upper surfaces" refer to surfaces of layers or elements directed away from the semiconductor substrate 60 and "lower surfaces" refer to surfaces of layers or elements directed toward the semiconductor substrate 60. It is further noted that "side surfaces" refer to surfaces of layers or elements oriented at non parallel direction, i.e., angles other than 0°, with respect to the upper/lower surfaces, e.g., substantially perpendicularly with respect to the upper/lower surfaces.

Positioning of the capping layer side portions 102 along side surfaces of the phase change material layer 96 and the top electrode 98 may protect the phase change material layer 96, e.g., protect from pollutants along peripheral regions of the phase change material layer 96, thereby producing a stabilized phase change of the phase change material layer 96. For example, if an interlayer insulating film, e.g., a silicon oxide film, is formed to insulate the phase change material layer 96, the capping layer sidewall portions 102 may protect the phase change material layer 96 from impurities generated during formation of the insulating silicon oxide layer, i.e., a high temperature process, thereby preventing or substantially minimizing effects of the impurities on a phase change of the phase change material layer 96.

As illustrated in FIG. 1, the phase change memory device may further include a third contact plug 112 electrically connected to the top electrode 98. The third contact plug 112 may be formed in a fourth contact hole (110 of FIG. 15) through a fourth interlayer insulation film 108. The third contact plug 112 may be on the top electrode 98, e.g., directly on the top electrode 98, so a lower portion of the contact plug 112 may be surrounded by the hard mask 100 and the upper surface of the top electrode 98, as illustrated in FIG. 1. In other words, since the capping layer sidewall portions 102 may not cover the upper surface of the top electrode 98, the third contact plug 112 may be positioned on the top electrode 98, so the hard mask 100 may be on the top electrode 98 between a side surface of the third contact plug 112 and a side surface of the capping layer sidewall portions 102. The hard mask 100 may be adapted to pattern the top electrode 98 and the phase change material layer 96, as will be described in more detail below.

The structure of the third contact plug 112 with respect to the capping layer sidewall portions 102 and the phase change material layer 96 may prevent or substantially minimize a lift error of the third contact plug 112, thereby increasing production yield. In contrast, if upper surfaces of the top electrode 98 and the hard mask 110 are surrounded with a capping layer 102a before forming the fourth contact hole 110 for the third contact plug 112, i.e., a portion of the capping layer 102a is not removed from the upper surface of the top electrode 98 before forming the fourth contact hole 110, when an alignment error is caused in forming the fourth contact hole 110 exposing the top electrode 98, e.g., when a bottom of fourth contact hole 110 is larger than the phase change material layer 96 and top electrode 98, a sidewall of the phase change material layer 96 may be exposed to the fourth contact hole 110. Exposure of the phase change material layer 96 to the fourth contact hole 110 may cause drifting of fumes from the phase change material layer 96 into the fourth contact hole 110, so metal, e.g., tungsten, may not be properly deposited in the fourth contact hole 110 to form the third contact plug 112, thereby causing a lift error of the third contact plug 112. A lift error of the third contact plug 112 may reduce reliability of the phase change memory device and reduced production yield thereof.

A method of manufacturing the phase change memory device illustrated in FIG. 1 will be described below with reference to FIGS. 1-17. FIGS. 2-17 illustrate cross-sectional views of sequential stages in a manufacturing method of a phase change memory device according to an embodiment.

Figure 18A:
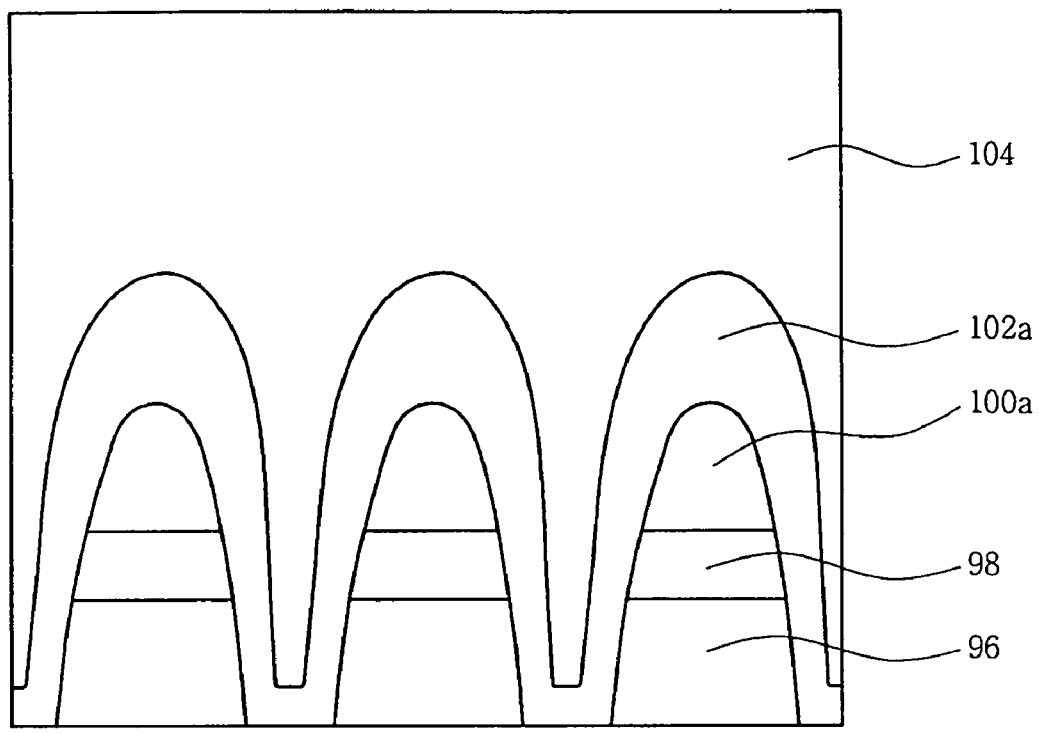
FIGS. 18A-18C illustrate photographs of cross-sectional views of sequential stages during removal of a portion of capping layer formed on a phase change material layer according to an example embodiment.
Figure 18B:
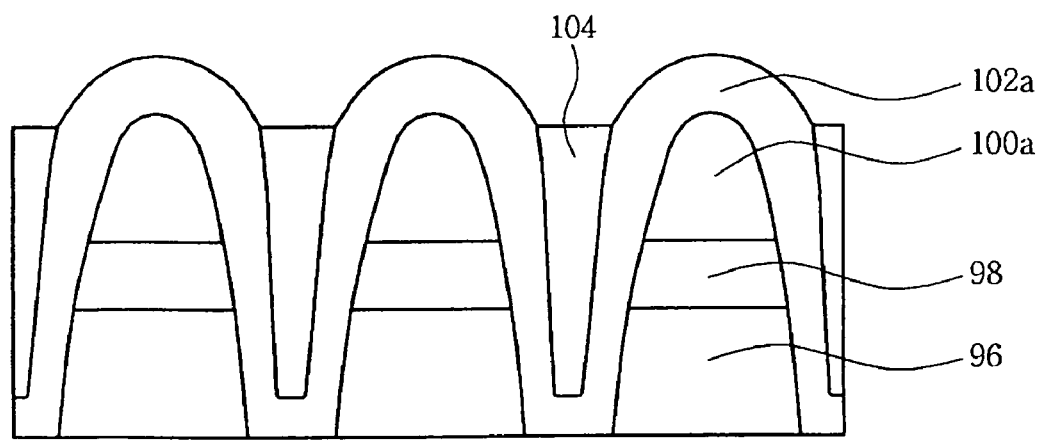
Figure 18C:
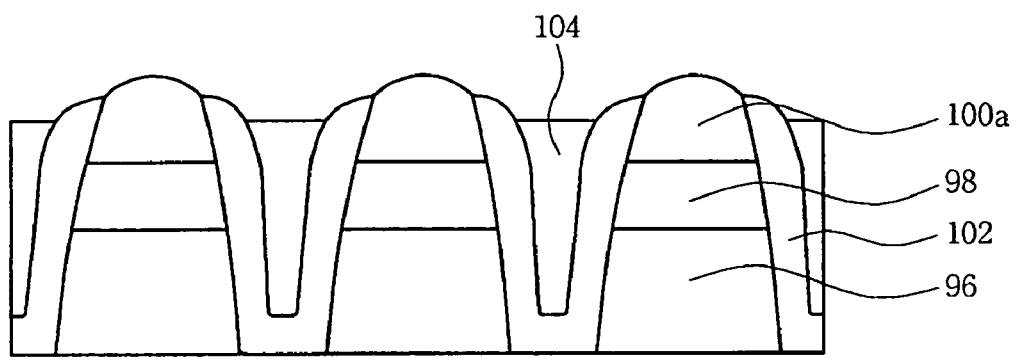
Figure 18D:
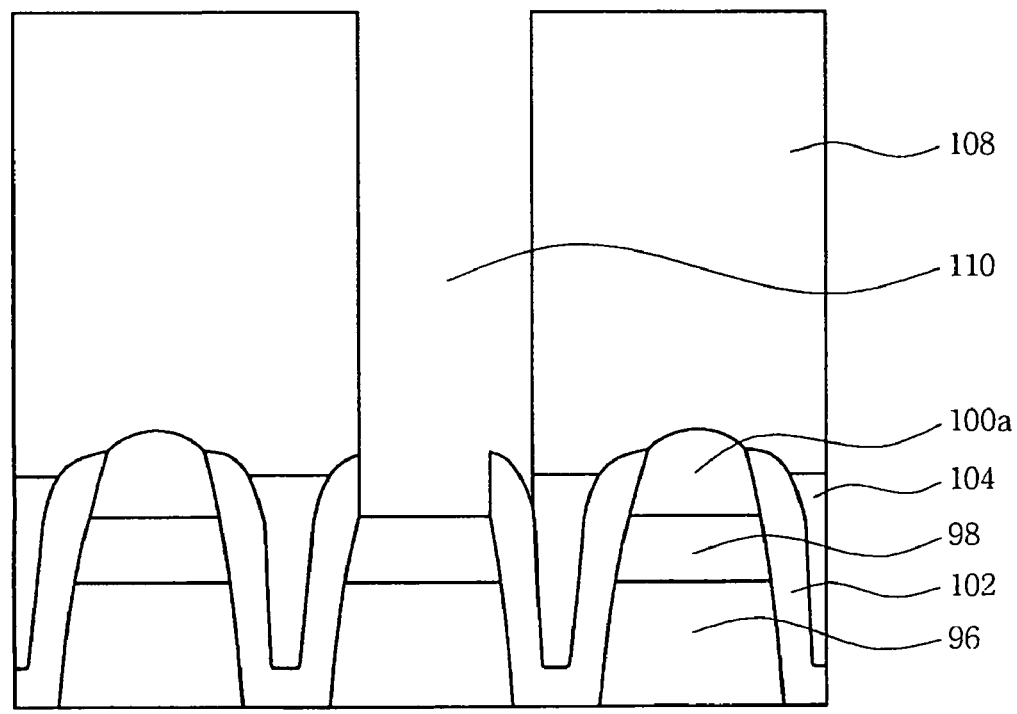
FIG. 18D illustrates a photograph of a cross-sectional view of a fourth contact hole formed in a memory device according to an example embodiment.

FIGS. 18A-18C illustrate cross-sectional views of sequential stages during removal of a capping layer formed on a phase change material layer and FIG. 18D illustrates formation of a fourth contact hole.

Figure 2:
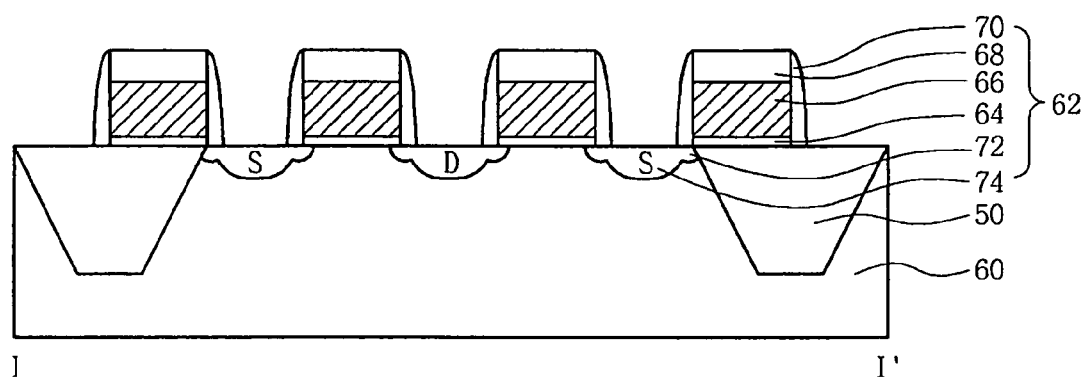
FIGS. 2-17 illustrate cross-sectional views of sequential stages in a manufacturing method of a phase change memory device according to an example embodiment.

Referring to FIG. 2, a shallow trench isolation 50 may be formed in the semiconductor substrate 60 to define an active area in semiconductor substrate 60, so a plurality of access transistors 62 may be formed in the active area on the semiconductor substrate 60. The shallow trench isolation 50 may be formed by, e.g., using a trench processor or LOCOS process.

The plurality of access transistors 62 may be formed as follows. First, a channel impurity area (not shown) may be formed in the active area of the semiconductor substrate 60 to a predetermined depth as measured from the upper surface of the semiconductor substrate 60. Next, a gate insulation film (not shown), a gate electrode film (not shown), a metal film (not shown), and a gate upper insulation film (not shown) may be sequentially formed on an entire upper surface of the semiconductor substrate 60. The gate insulation film, gate electrode film, metal film, and gate upper insulation film may be patterned, e.g., by a photo etching process, to form the gate insulation layer 64, the gate electrode 66, a metal layer, and the gate upper insulation layer 68, respectively, to provide a plurality of gate stacks on the semiconductor substrate 60. The gate stacks may be spaced apart from each other to expose portions of the upper surface of the semiconductor substrate 60 therebetween, i.e., portions of the semiconductor substrate 60 to become the source/drain areas S/D.

The gate insulation layer 64 may include, e.g., a silicon oxide, and may be formed by, e.g., a thermal oxidation method. The gate electrode 66 may include, e.g., a polysilicon layer containing conductive impurities. The metal layer may include, e.g., tungsten silicide or titanium silicide, and may define the word line. The gate upper insulation layer 68 may include, e.g., a silicon nitride or a silicon oxynitride.

Once the gate stacks are formed, N or P-type impurities may be ion-implanted into the exposed portions of the upper surface of the semiconductor substrate 60 between adjacent gate stacks, i.e., using the gate stacks as an ion implantation mask, to form a first impurity area 72 in the source/drain areas S/D. A silicon nitride layer having a predetermined thickness may be formed on the semiconductor substrate 60 to cover side surfaces of the gate stacks and the first impurity areas 72, followed by removal of portions of the silicon nitride layer, e.g., by a dry etching method having a prominent anisotropy etching characteristic, to expose portions of the source/drain areas S/D between adjacent first impurity areas 72 to form spacers 70 on side surfaces of the gate stacks. In other words, as illustrated in FIG. 2, spacers 70 may be formed on the first impurity areas 72 along sidewalls of the gate stacks. Next, additional P or N-type conductive impurities may be ion implanted in the source/drain areas S/D between adjacent spacers 70, i.e., using the spacers 70 as ion implantation masks, through a self-alignment method to form a second impurity area 74 between adjacent first impurity areas 72.

Figure 3:
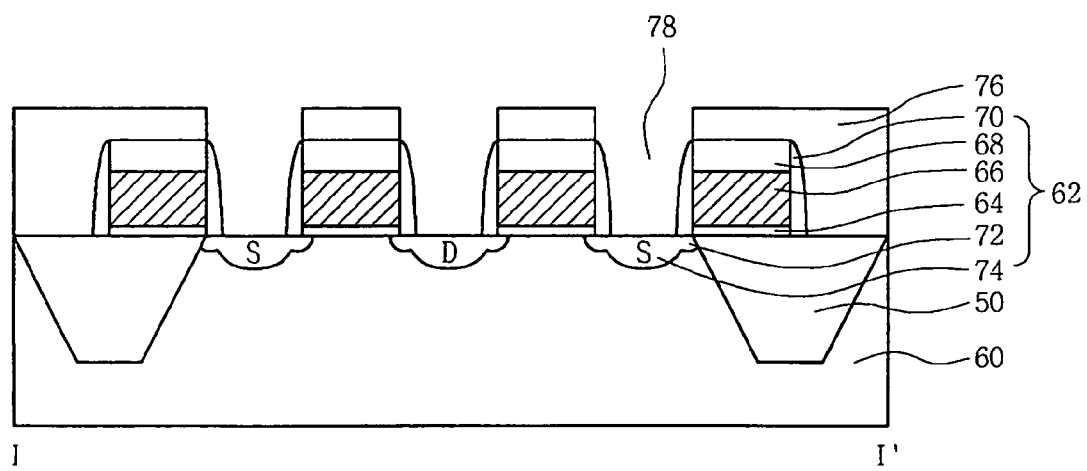

Referring to FIG. 3, a first interlayer insulation layer (not shown) may be formed on the semiconductor substrate 60 to cover the gate stacks and the source/drain areas S/D therebetween, i.e., to cover the second impurity areas 74. The first interlayer insulation layer may be patterned, e.g., by a photo etching process, to remove portions thereof, such that a first interlayer insulation film 76 with first contact holes 78 therethrough may be formed. The first interlayer insulation film 76 may be on the gate stacks and on the trench isolation 50, so the first contact holes 78 may be formed to expose the surface of the semiconductor substrate 60 in the source/drain areas S/D.

The first interlayer insulation film 76 may include, e.g., a silicon oxide layer, and may be formed by, e.g., a thermal oxidation method, a chemical vapor deposition (CVD) method, and so forth. Examples of the silicon oxide used in the thermal oxidation method may include High Temperature Oxide (HTO), Middle Temperature Oxide (MTO), Middle Temperature Oxide Nitride Oxide ($MTON_2O$). Examples of the silicon oxide used in the CVD method may include TEOS, USG, SOG, or high density plasma (HDP) oxide. For example, formation of a silicon oxide layer formed by a CVD method may include an Atmospheric Pressure Chemical Vapor Deposition (APCVD) process performed at an atmospheric pressure with respect to pressure, temperature, and energy conditions. In another example, a CVD method may be performed by a Low Pressure CVD (LPCVD) process at a low pressure atmosphere or by a Plasma Enhanced CVD (PECVD) process, i.e., plasma environment.

The first interlayer insulation layer may be formed to have a uniform thickness on the semiconductor substrate 60, and may be planarized, e.g., by a chemical mechanical polishing (CMP) method, to facilitate formation of the first contact holes 78. For example, the first interlayer insulation layer may be patterned by a dry etching method that uses a photoresist layer (not shown) as an etching mask to selectively expose regions of the first interlayer insulation layer above the source/drain areas S/D, so the first contact holes 78 may expose the source/drain areas S/D through a self-alignment using a spacer. For example, when the first interlayer insulation film 76 is formed of a HDP oxide having a thickness of about 2,000 angstroms, pressure inside a process chamber of a dry etching apparatus may be maintained at about 35 mT, and RF power may be set about 400 W. Next, the first contact hole 78 may be formed by injecting an etch reactive gas, e.g., $CF_4$, $C_4F_6$, and/or $C_5F_8$, into the process chamber.

Figure 4:
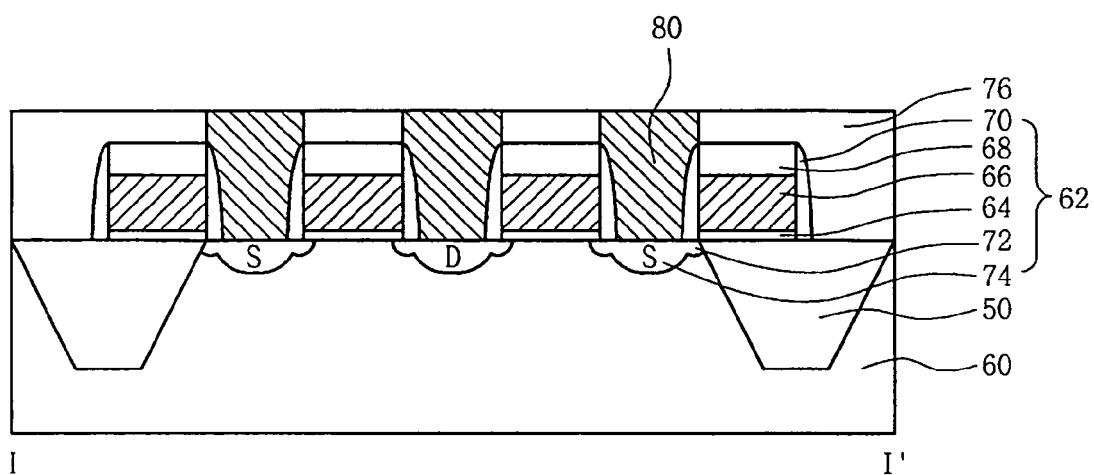

Referring to FIG. 4, a first contact plug 80, i.e., a first pad electrode 80, may be formed in the first contact hole 78. The first contact plug 80 may be formed by depositing a conductive layer, e.g., one or more of polysilicon doped with conductive impurity, tungsten silicide, aluminum silicide, aluminum (Al), tantalum (Ta), and copper (Cu), in the first contact hole 78, by any suitable method, e.g., a CVD method, followed by removing a portion of the conductive layer to expose an upper surface of the first interlayer insulation film 76. A portion of the conductive layer in the first contact hole 78 may define the first contact plug 80. The first contact plug 80 may be electrically coupled to the source/drain areas S/D on the semiconductor substrate 60 through the first contact hole 78.

Figure 5:
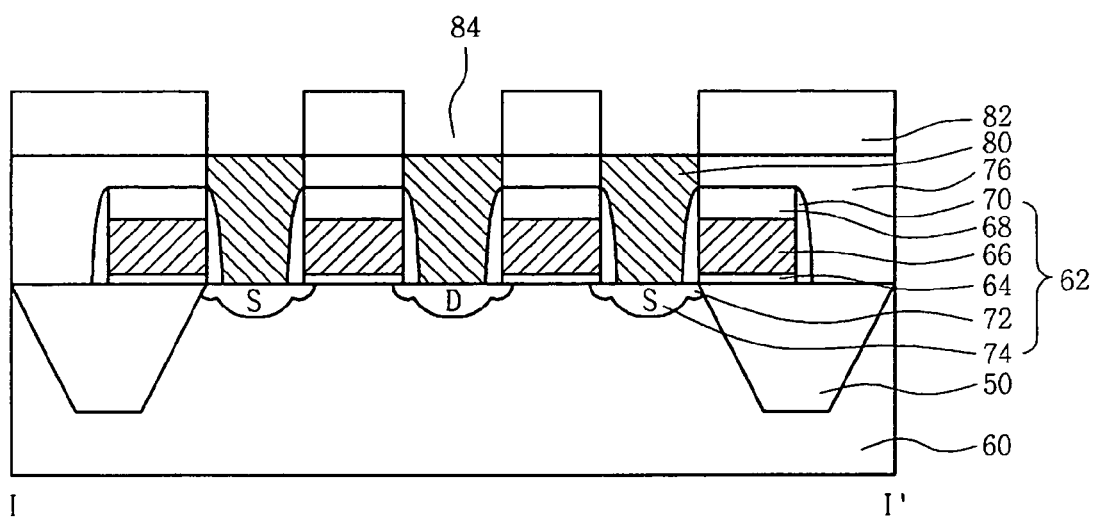

Referring to FIG. 5, a second interlayer insulation layer (not shown) having a predetermined thickness may be formed on an entire face of semiconductor substrate 60 to cover the first interlayer insulation film 76 and the first contact plug 80. The second interlayer insulation layer may be patterned, e.g., by a photo etching process, to remove portions thereof, such that a second interlayer insulation film 82 with second contact holes 84 therethrough may be formed. The second interlayer insulation film 82 may be on the gate stacks and on the trench isolation 50, so the second contact holes 84 may be formed to expose an upper surface of the first contact plug 80, i.e., above the source/drain areas S/D.

The second interlayer insulation film 82 may be formed of silicon oxide, e.g., Boron Phosphorus Silicate Glass (BPSG), having a thickness of about 2,000 angstroms to about 5,000 angstroms. For example, the second contact hole 84 may be formed by, e.g., an anisotropic dry etching method using a pattern mask (not shown), to selectively form the second interlayer film 82 on the gate stacks and the second contact hole 84 on the first contact plugs 80, as illustrated in FIG. 5. In another example, the second contact hole 84 may be formed by injecting an etch reactive gas, e.g., one or more of $CF_4$, $C_4F_6$ and $C_5F_8$, into a process chamber. For example, a second interlayer insulation layer having a thickness of about 2,500 angstroms may be removed within about 30 seconds by the etch reactive gas having a gas flow of $CF_4$ at about 80 sccm and $O_2$ at about 20 sccm, at RF power of about 45 W.

Figure 6:
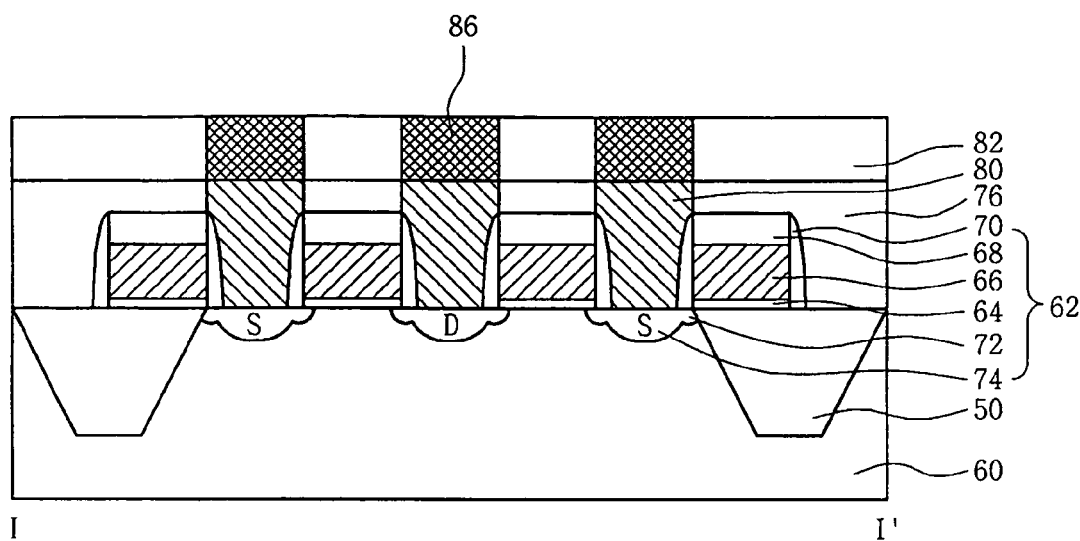

Referring to FIG. 6, a second contact plug 86, i.e., a bit line contact electrode 86, may be formed in the second contact hole 84. The second contact plug 86 may be formed by depositing a polysilicon layer containing conductive impurity and/or a conductive metal layer, e.g., one or more of titanium, titanium silicide, tungsten, and tungsten silicide, on an entire face of the semiconductor substrate 60 to fill the second contact hole 84. A portion of the metal layer and/or polysilicon layer may be removed, e.g., planarized, to expose an upper surface of the second interlayer insulation film 82. A portion of the metal layer and/or polysilicon layer in the second contact hole 84 may define the second contact plug 86.

Figure 7:
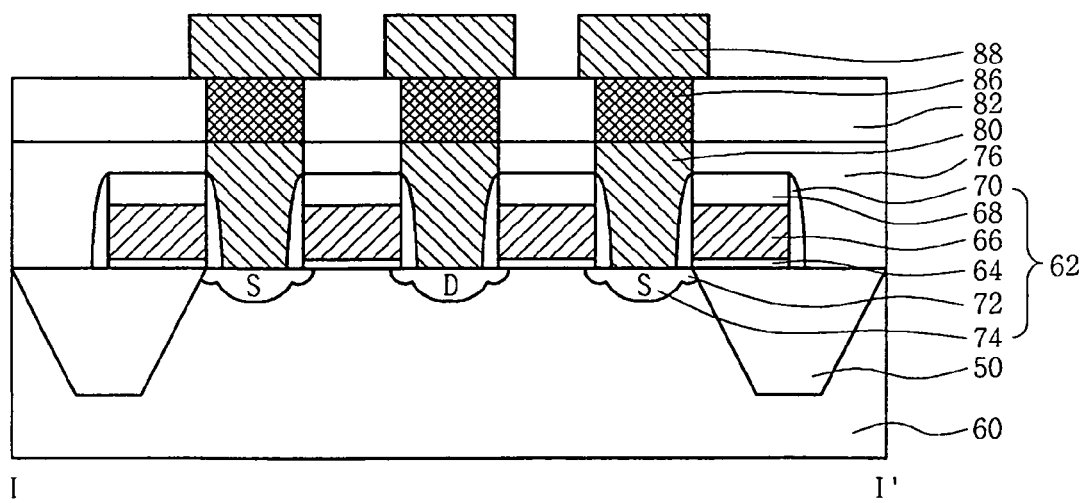

Referring to FIG. 7, the bit line 88 may be formed on the second contact plug 86. The bit line 88 may be formed by depositing a metal layer or a polysilicon layer doped with conductive impurities on an entire upper surface of the semiconductor substrate 60, e.g., on upper surfaces of the second contact plugs 86 and of the second interlayer insulation film 82, followed by patterning the metal layer or polysilicon layer to form the bit line 88. The metal layer or polysilicon layer may be patterned by removing portions thereof via, e.g., an anisotropic dry etching method using a photoresist layer as a mask layer that shields the metal layer or polysilicon layer. The bit line 88 may be a wire intersecting the word line formed on the gate electrode 66 of the access transistor 62, and may be above the source/drain area S/D.

For example, the bit line 88 may be confined to an upper portion of the drain area D and/or may function as a buffer layer in an upper part of the source area S for electrically connecting the bottom electrode 94 to the second contact plug 86. It is noted that the second contact plug 86 and the bit line 88 may be formed separately or may be formed through a single deposition and patterning process to form a contact pad, e.g., a metal layer or a polysilicon layer doped with conductive impurities may be deposited in the second contact hole 84 and on the second interlayer insulation layer 82 to form the contact pad in the second contact hole 84 projecting a portion of the upper surface of the second interlayer insulation film 82. The access transistor 62 and the contact pad, i.e., a structure corresponding to the second contact plug 86 with the bit line 88, may be a conductive structure body.

Figure 8:
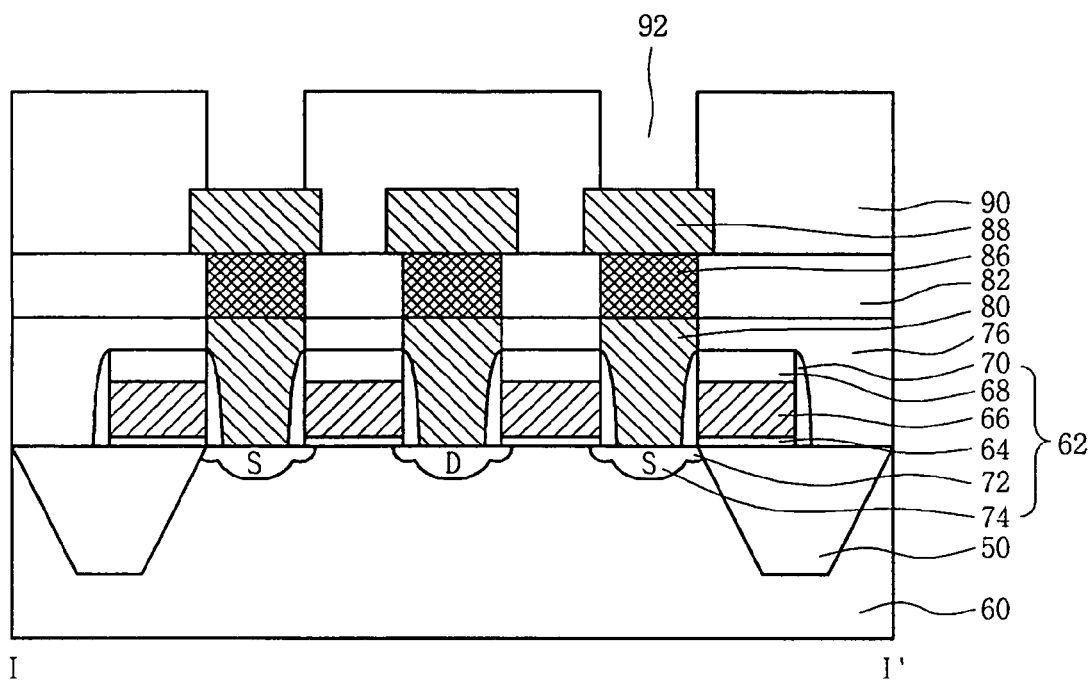

Referring to FIG. 8, a third interlayer insulation layer (not shown) may be formed on the semiconductor substrate 60, e.g., on the bit line 88 and the second interlayer insulation film 82. The third interlayer insulation layer may be patterned to form a third interlayer insulation film 90 with third contact holes 92 therethrough. The third interlayer insulation layer may be patterned, e.g., by anisotropically removing portions above the source area S, so the third contact holes 92 may expose an upper surface of the bit line 88 above the source area S. For example, the third interlayer insulation film 90 may be formed of HDP silicon oxide, e.g., to a thickness of about 3,000 angstroms to about 8,000 angstroms, to substantially reduce a step coverage formation causable by the bit line 88 that may be projected from the surface of semiconductor substrate 60. A CMP process may be added to planarize the third interlayer insulation film 90, e.g., when the third interlayer insulation film 90 is not planarized by the bit line 88.

Figure 9:
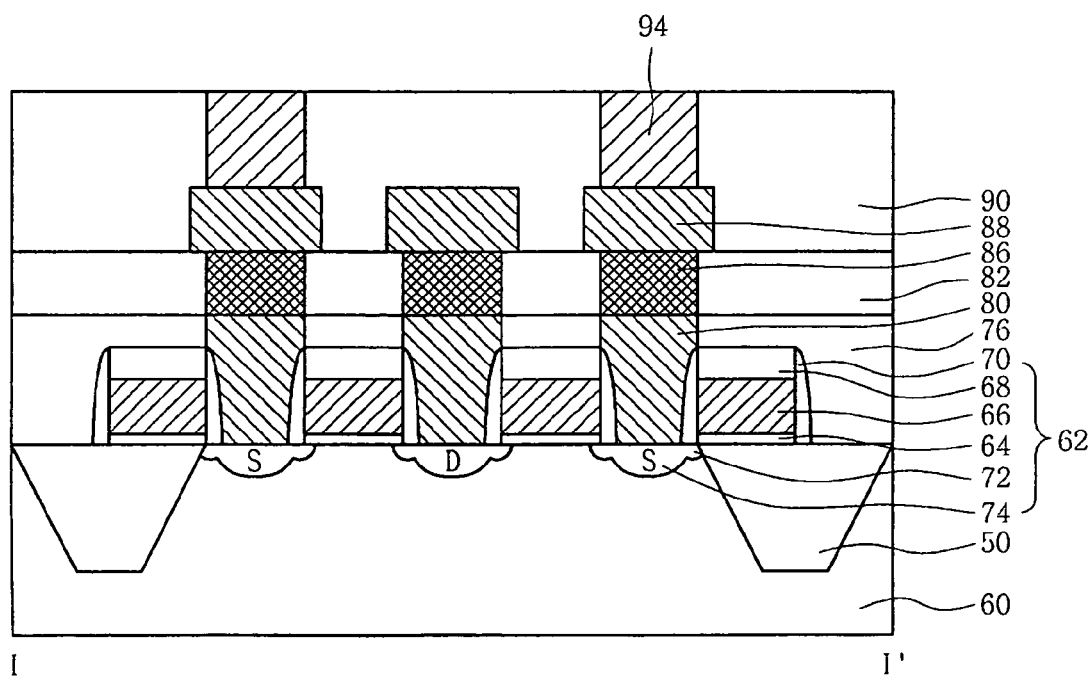

Referring FIG. 9, the bottom electrode 94 may be formed in the third contact hole 92. The bottom electrode 94 may be formed by depositing a conductive metal layer on an entire surface of the semiconductor substrate 60, e.g., inside the third contact hole 94 and on an upper surface of the third interlayer insulation film 90. The conductive metal layer may be patterned, e.g., portions of the conductive metal layer may be removed by planarization, to expose the upper surface of the third interlayer insulation film 90. A portion of the conductive metal layer remaining in the third contact hole 94 may define the bottom electrode 94. The conductive metal layer forming the bottom electrode 94 may include titanium (Ti), e.g., one or more of Ti, TiN and TiON, deposited through, e.g., the CVD method. The bottom electrode 94 may be formed to have a height, i.e., a distance as measured along a direction oriented from the semiconductor substrate 60 toward the bit line 88, corresponding to a height of the third contact hole 92. Accordingly, the upper surface of the third interlayer insulation film 90 may be substantially level, i.e., coplanar, with an upper surface of the bottom electrode 94.

Figure 10:
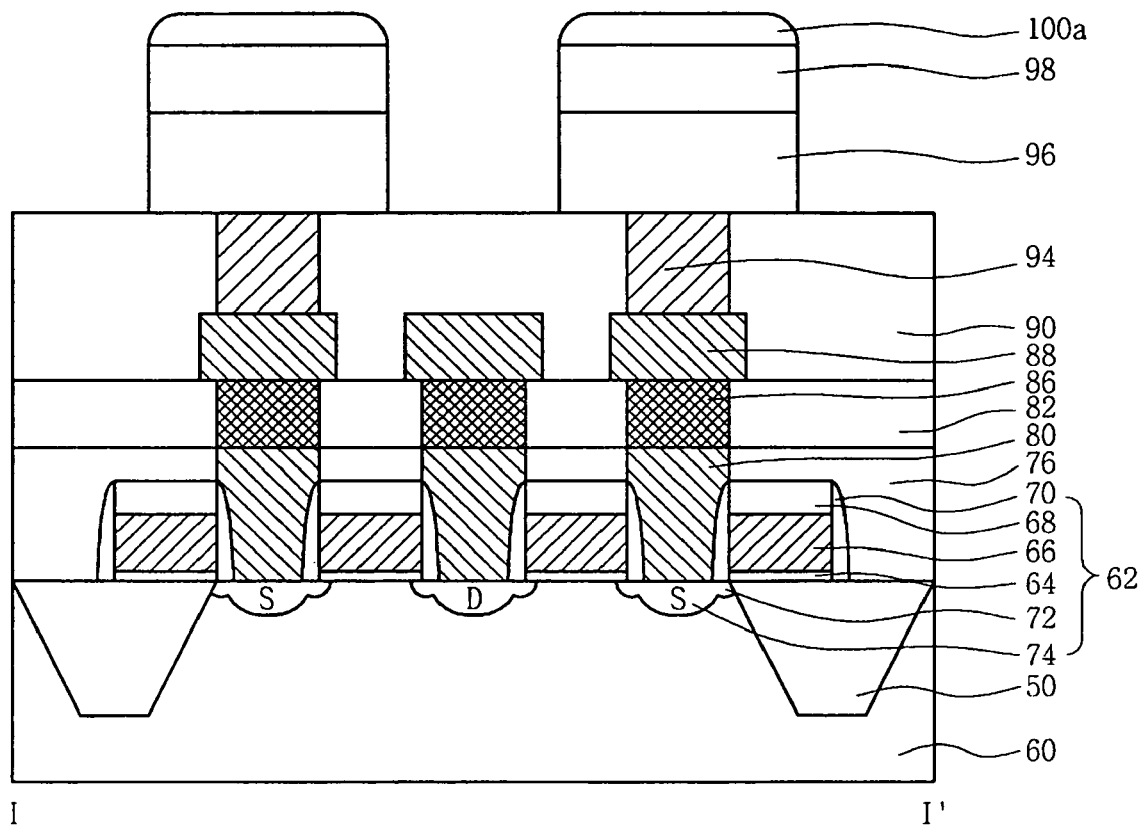

Referring to FIG. 10, the phase change material layer 96 with a separation of node, the top electrode 98, and a hard mask layer 100a may be sequentially formed on the bottom electrode 94. The phase change material layer 96 and the top electrode 98 may be patterned, e.g., through a dry etching method using the hard mask layer 100a as a mask layer. For example, the top electrode 98 may be formed of a conductive metal layer having a dominant reflectivity, e.g., tungsten (W), aluminum (Al), and so forth, and the hard mask layer 100a may be formed to a predetermined thickness of, e.g., a silicon oxide having a constant reflectivity. A photoresist pattern layer (not shown) may be formed on the hard mask layer 100a, e.g., a photoresist pattern layer that may be used in an exposure apparatus of ArF of a predetermined level having a relatively high permeability, so the hard mask layer 100a may be patterned, e.g., via dry etching, through the photoresist pattern layer without damaging the top electrode 98. Once the hard mask layer 100a is patterned, the photoresist pattern layer may be removed, and the top electrode 98 and the phase change material layer 96 may be patterned using the hard mask layer 100a as a mask. It is noted that during patterning of the top electrode 98 and the phase change material layer 96, portions of the hard mask layer 100a may be removed, e.g., height of the hard mask layer 100a may be reduced.

The phase change material layer 96 may be include one or more of Ge, Sb, Te, Se, Bi, Pb, Sn, As, S, Si, P, O and their mixture or alloy, and may be formed through the CVD method. If the phase change material layer 96 includes more than one component, a mixing ratio and rate of the components may be adjusted to control phase change conditions of the phase change material layer 96. The phase change material layer 96 may be formed at about 100° C. to about 300° C., so an initial state of the phase change material layer 96 may be amorphous, i.e., state during deposition of phase change material layer 96 on the bottom electrode 94.

The top electrode 98 may be formed of a conductive metal layer on the phase change material layer 96, and may be formed through the CVD method or through a physical deposition method, e.g., a sputtering method. The top electrode 98 may be formed of a substantially same material as the bottom electrode 94 or of a different material. A deposition temperature of the top electrode 98 may be adjusted to maintain the initial state of the phase change material layer 96, i.e., an amorphous state of the phase change material layer 96 during deposition, so the temperature of the phase change material layer 96 may not be varied.

For example, since phase change, i.e., phase transition, of the phase change material layer 96 may be triggered by an increased temperature, e.g., application of current thereto via the top and/or bottom electrodes 98 and 94, the initial amorphous state of the phase change material layer 96 may be maintained by controlling the deposition temperature of the top electrode 98. In contrast, if the deposition temperature of the top electrode 98 is too high, portions of the phase change material layer 96 may be transformed into a crystalline state in bulk along a direction oriented from a surface of the phase change material layer 96 adjacent to the top electrode 98 to an opposing surface of the phase change material layer 96, thereby causing the initial amorphous state of the phase change material layer 96 to include crystalline portions. For example, a phase change material layer 96 substantially at an amorphous state having a portion of an edge at a crystalline state may have current leakage through the crystalline portion, and phase transition of the crystalline portion may be hard to control, e.g., phase transition may not occur.

Figure 11:
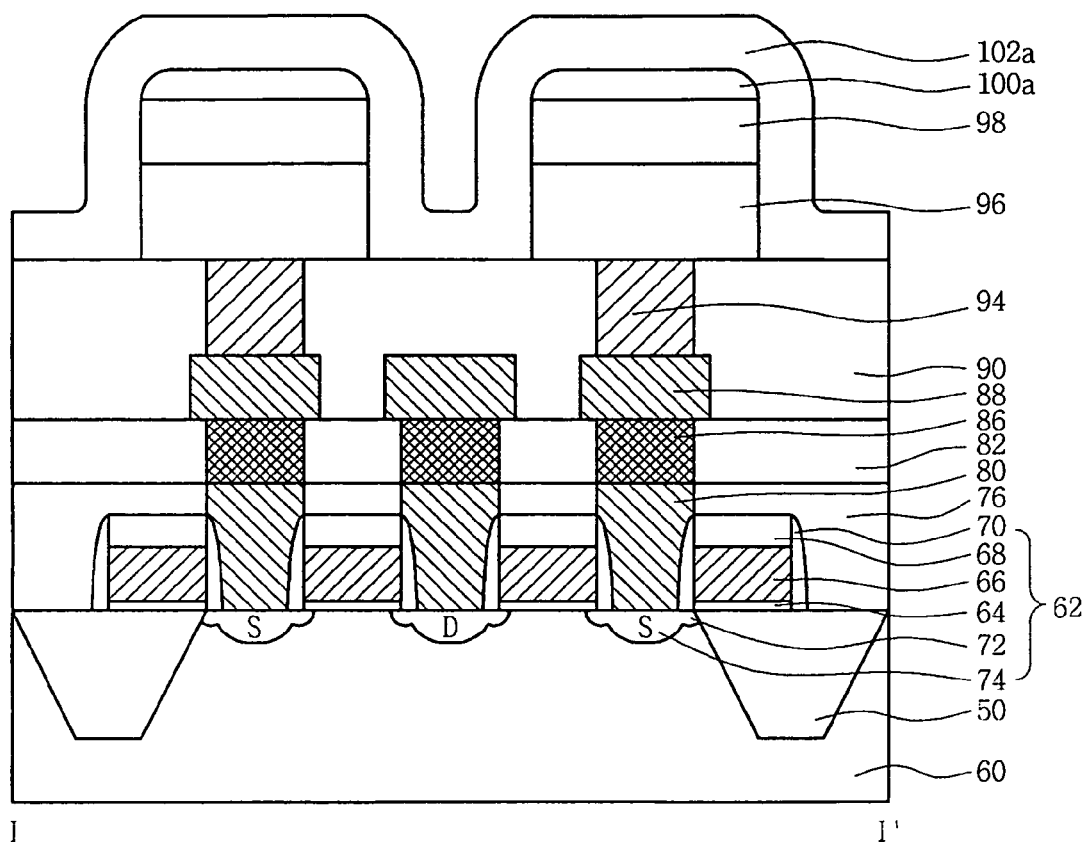

Referring to FIG. 11, a capping layer 102a may be deposited on an entire surface of the semiconductor substrate 60 to cover sidewalls of the phase change material layer 96 and the top electrode 98 and an upper surface of the hard mask layer 100a. The capping layer 102a may have a predetermined thickness, and may be deposited conformal, e.g., using CVD or another conformal deposition process, on the upper surface of the third interlayer insulation film 90 and on a structure including the phase change material layer 96, the top electrode 98, and the hard mask layer 100a. Accordingly, the phase change material layer 96 may be surrounded by the capping layer 102a, so sidewalls and upper portion of the phase change material layer 96 may be completely enclosed by the capping layer 102a and the top electrode 98. It is noted that the term "conformally" corresponds to a layer formed with a uniform thickness or substantially uniform thickness along a profile of an underlying layer or structure. The capping layer 102a may include, e.g., one or more of a silicon nitride or a silicon oxynitride.

The capping layer 102a may be formed to protect the phase change material layer 96 from high temperature, thereby preventing or substantially minimizing an unstable phase state of the phase change material layer 96 due to temperature fluctuation. For example, the capping layer 102a may protect the phase change material layer 96 from a temperature increase during a high temperature heat treatment performed in a subsequent process. In another example, the capping layer 102a may protect the phase change material layer 96 from a temperature increase due to pollutant diffusion from the fourth interlayer insulation film 108 into the phase change material layer 96, i.e., the capping layer 102a may prevent contact between the fourth interlayer insulation film 108 and the phase change material layer 96, thereby increasing reliability of the memory device.

Figure 12:
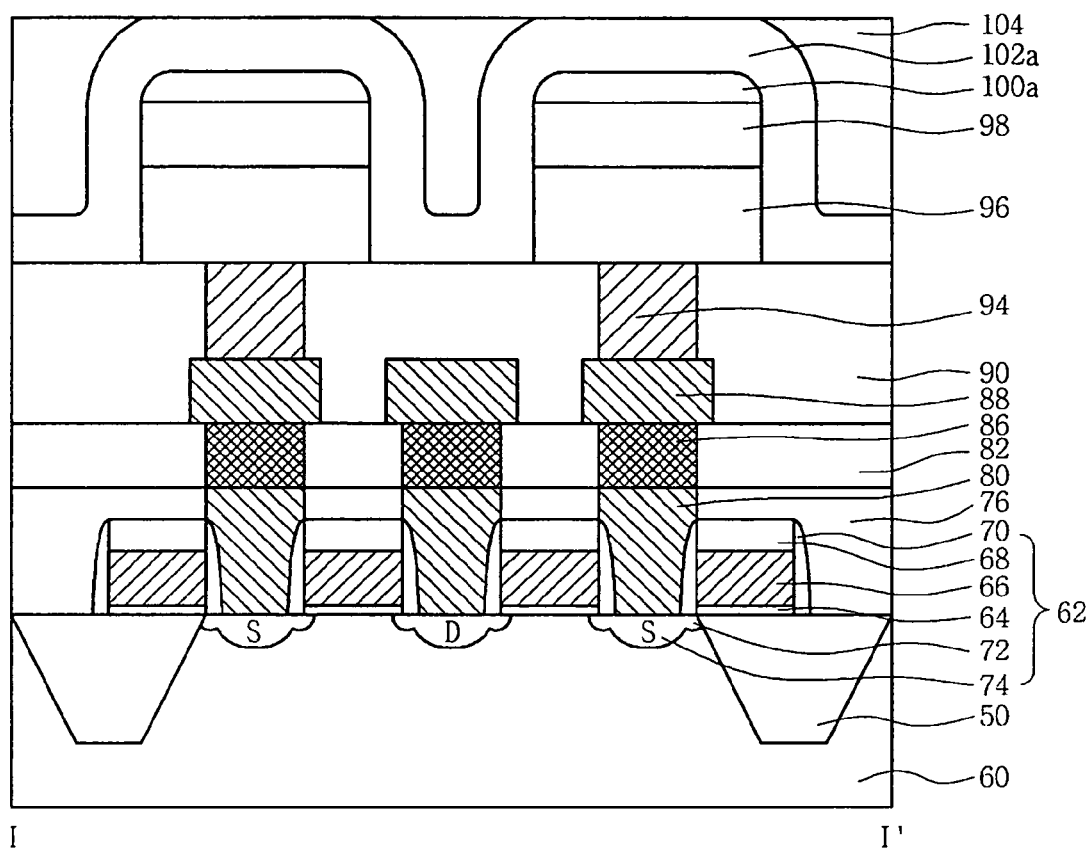

Referring to FIG. 12, a dummy interlayer insulation layer film 104 may be formed to selectively expose an upper surface of the capping layer 102a. In particular, the dummy interlayer insulation film 104 may expose portions of the upper surface of the capping layer 102a that overlap an upper surface of the hard mask layer 100a. For example, a dummy interlayer insulation layer (not shown) may be formed of a silicon oxide layer via a CVD method employing, e.g., TEOS, USG, SOG or a HDP oxide, to a predetermined thickness to cover the entire surface of the semiconductor substrate 60. Then, the dummy interlayer insulation layer may be planarized, e.g., via the CMP method, to remove an upper portion thereof to form the dummy interlayer insulation film 104. The dummy interlayer insulation film 104 may expose the upper surface of the capping layer 102a corresponding to and overlapping the hard mask layer 100a. Accordingly, the dummy interlayer insulation film 104 may be formed along sidewalls, e.g., on the periphery, of the capping layer 102a, so the capping layer 102a on the hard mask layer 100a may be self aligned and etched in a subsequent process. For example, a width of the exposed upper surface of the capping layer 102a may substantially equal a width of the hard mask layer 100a along the x-axis.

It is noted that when, due to an integration increase of the memory devices, a surface area of an upper surface, i.e., planar size, of the phase change material layer 96 and the top electrode 98 is reduced, the hard mask layer 100a and the capping layer 102a may have curved upper surfaces, as illustrated in FIGS. 18A-18B. In other words, the upper surfaces of the hard mask layer 100a and the capping layer 102a may protrude upward to have predetermined radii of curvature according to an increase of stack step coverage of a vertical direction, i.e., along the y-axis. When upper surfaces of the hard mask layer 100a and the capping layer 102a are curved as illustrated in FIGS. 18A-18B, a width of the upper surface of the capping layer 102a along the x-axis exposed by planarizing the dummy interlayer insulation film 104 may be relatively small, so the dummy interlayer insulation film 104 may be additionally etched back through the dry etching method to increase the width of the exposed upper surface of the capping layer 102a, as illustrated in FIG. 18B. Accordingly, the dummy interlayer insulation film 104 may be buried at a predetermined level between side portions of the capping layer 102a, as further illustrated in FIG. 18B.

Figure 13:
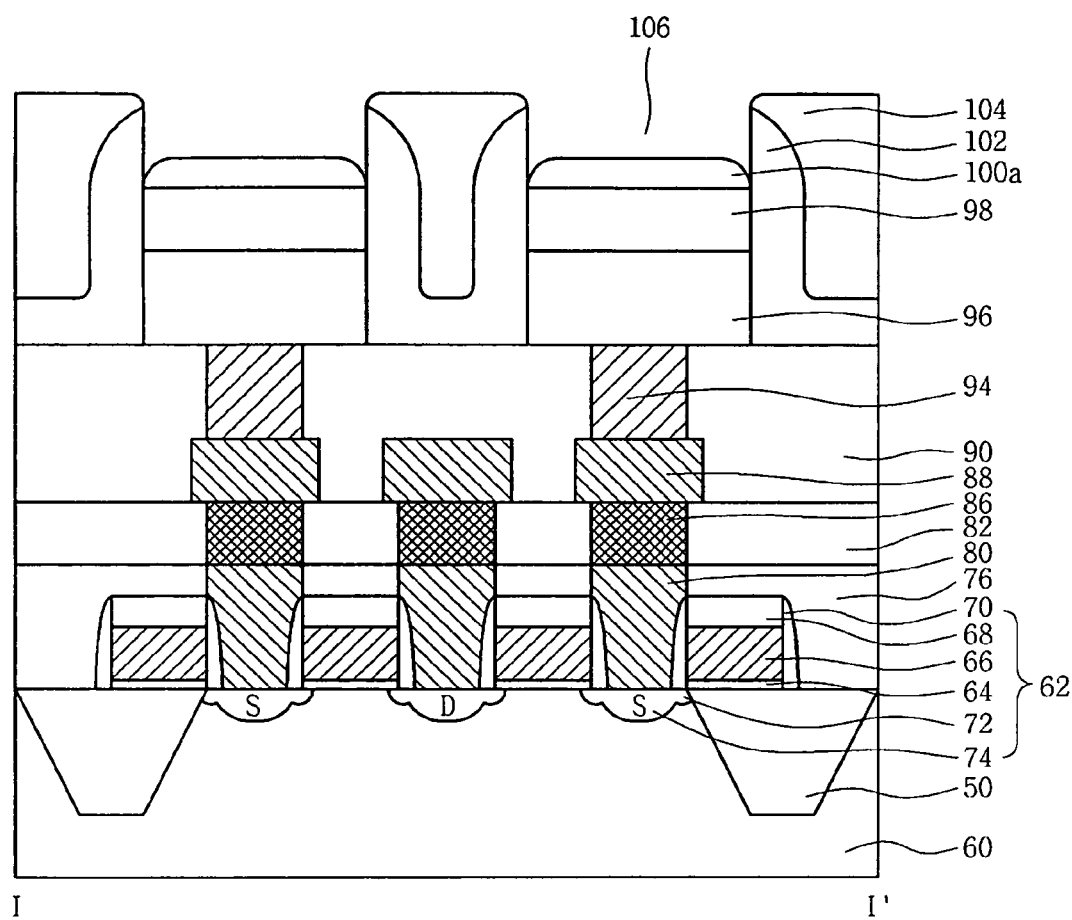

Referring to FIG. 13, an upper portion of the capping layer 102a selectively exposed by the dummy interlayer insulation film 104 and covering the hard mask layer 100a may be removed anisotropically, e.g., via dry etching using the dummy interlayer insulation film 104 as a mask, to expose the upper surface of the hard mask layer 100a. That is, the capping layer 102a surrounding the phase change material layer 96, the top electrode 98, and the hard mask layer 100a may be selectively etched to expose an upper surface of the hard mask layer 100a. For example, the upper portion of the capping layer 102a may be removed by a reactive gas, e.g., $CH_2F_2$. For example, if the capping layer 102a is a silicon nitride layer with a thickness of about 300 angstroms, the upper portion thereof may be removed by applying $CH_2F_2$ at 20 sccm, $O_2$ at 20 sccm, and Ar at 180 sccm at a power of about 200 W for about 57 seconds. It is noted that if the hard mask layer 100a has a predetermined thickness, i.e., a sufficiently high thickness, portions of the dummy interlayer insulation film 104 and the capping layer 102a may be removed during the planarization to expose the upper surface of the hard mask layer 100a.

Once the upper portion of the capping layer 102a is removed, the upper surface of the hard mask layer 100a may be exposed and the capping layer sidewall portions 102 may extend above the hard mask layer 100a, as illustrated in FIG. 13. The capping layer sidewall portions 102 may define a dummy contact hole 106 above the hard mask layer 100a. Alternatively, as illustrated in FIG. 18C, after the upper portion of the capping layer 102a is removed, the capping layer sidewall portions 102 may have a substantially same or similar height as the dummy interlayer insulation film 104. Accordingly, as illustrated in FIG. 18C, the hard mask layer 100a may protrude above the capping layer sidewall portions 102, so an upper surface of the hard mask layer 100a is positioned further from the top electrode 98, as compared to an upper surface of the capping layer 102. It is noted with respect to FIG. 18C that even though the hard mask layer 100a protrudes above the capping layer sidewall portions 102, the capping layer sidewall portions 102 may completely surround sidewalls of the phase change material layer 96 and of the top electrode 98, and may surround the periphery of the hard mask layer 100a.

The capping layer 102a according to an example embodiment may be removed through a self-alignment by using the dry etching method and the dummy interlayer insulation film 104 as a mask, so manufacturing costs of the memory device may be reduced. In contrast, if a capping layer is not removed through a self-alignment and requires a photoresist pattern layer thereabove, a production unit cost of the memory device may increase due to high cost of the photoresist pattern layer, i.e., a material photosensitive to short wavelengths and corresponding to a precise formation of a micro pattern based on an integration tendency of the memory device. Therefore, since the capping layer 102 may not require a photoresist pattern layer, production costs of the memory device may be substantially reduced.

Figure 14:
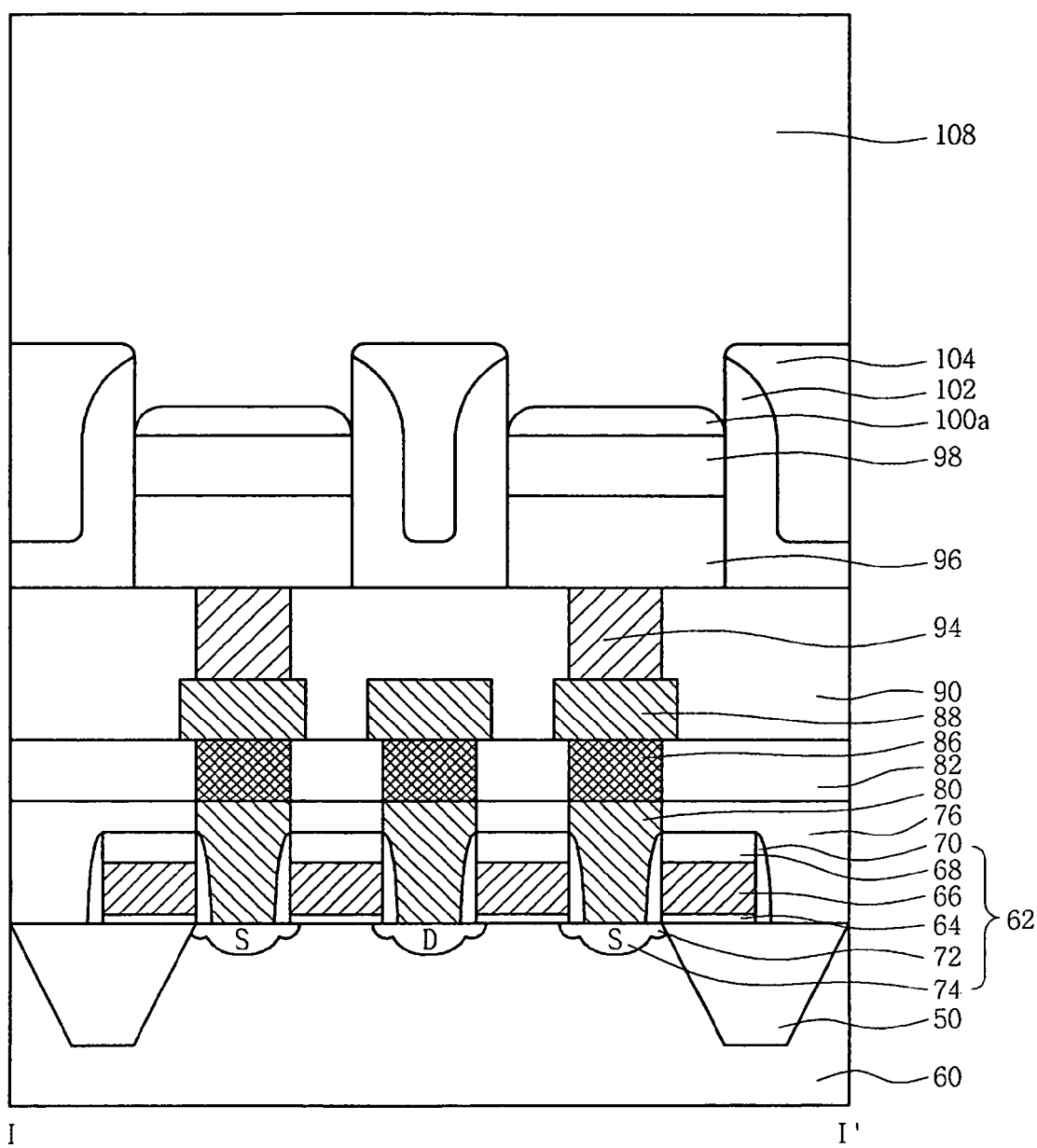

Referring to FIG. 14, the fourth interlayer insulation film 108 may be formed to a predetermined thickness on the dummy interlayer insulation film 104 and on the hard mask layer 100a, i.e., to fill the dummy contact hole 106. The fourth interlayer insulation film 108 may include a silicon oxide formed through the CVD method employing, e.g., TEOS, USG, SOG or HDP method without a high-temperature heat treatment. The fourth interlayer insulation film 108 may be formed to the predetermined thickness to bury the inside of the dummy contact hole 106 recessed by a level or below of the dummy interlayer insulation film 104 as not to cause a step coverage. For example, when step coverage may be generated on the surface of the fourth interlayer insulation film 108, a process of planarizing the fourth interlayer insulation film 108 may be added.

Figure 15:
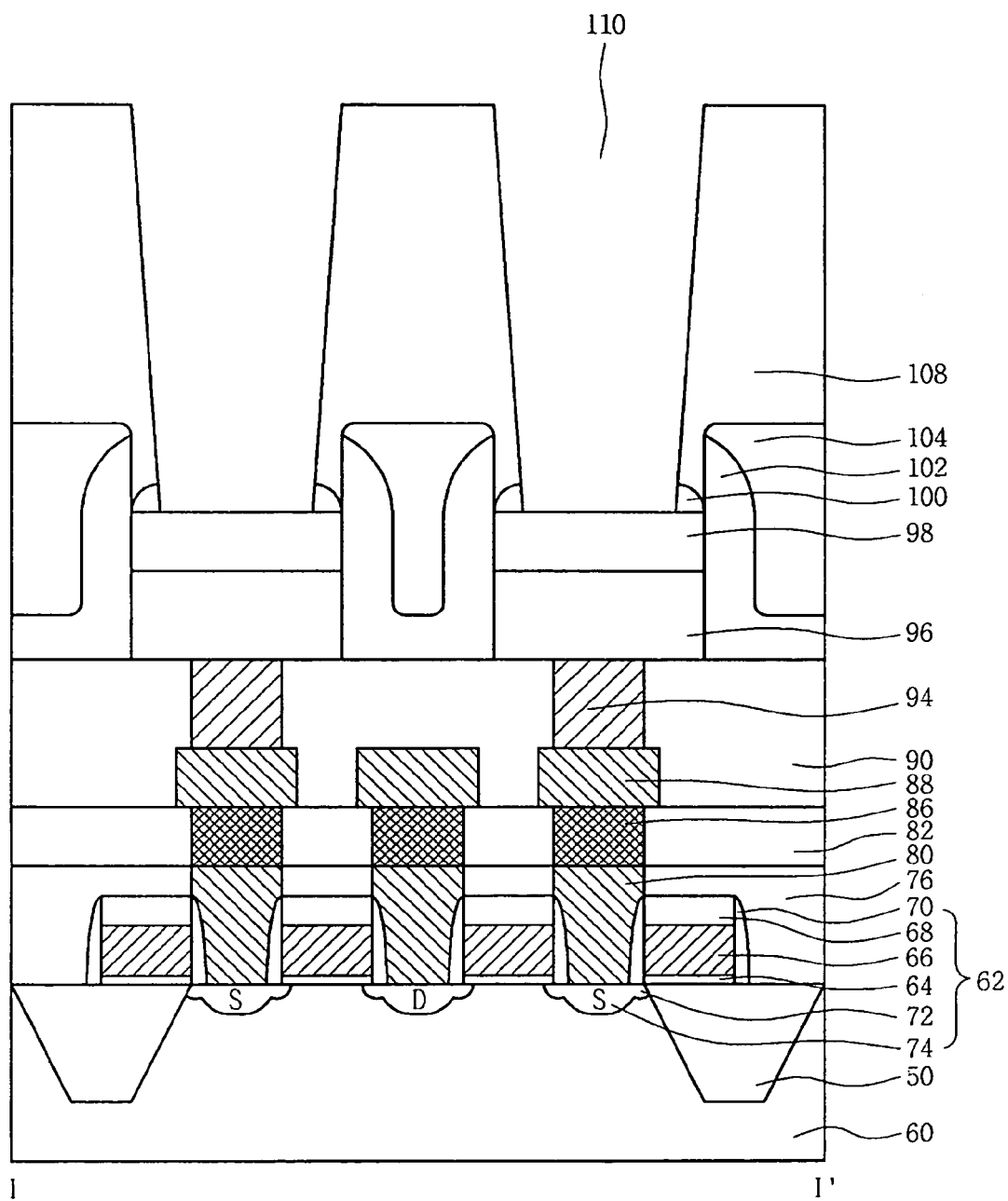

Referring to FIG. 15, portions of the fourth interlayer insulation film 108 and portions of the hard mask layer 100a may be removed, e.g., simultaneously, to expose an upper surface of the top electrode 98 and form the fourth contact hole 110. For example, portions of the fourth interlayer insulation film 108 and of the hard mask layer 100a may be removed anisotropically, e.g., through the dry etching method using a photoresist pattern layer as an etching mask layer selectively exposing the fourth interlayer insulation film 108 formed on the top electrode 98. The fourth interlayer insulation film 108 and the hard mask layer 100a may be formed of a silicon oxide, thus can be easily removed from the top electrode 98, e.g., by a substantially same reactive gas in a single processing step. For example, the reactive gas, e.g., one or more of $CF_4$, $C_4F_6$ and $C_5F_8$, may have a predetermined etch selectivity rate with respect to, e.g., a silicon nitride layer of the capping layer 102a.

It is noted that since the capping layer sidewall portions 102 are only along sidewalls of the phase change material layer 96 and of the top electrode 98, the etching process of the fourth interlayer insulation film 108 and of the hard mask layer 100a may not require removal of portions of the capping layer 102 in order to form the fourth contact hole 110. In other words, an upper portion of the capping layer 102a may be completely removed from the upper surface of the hard mask layer 100a, so only the capping layer sidewall portions 102 remain to surround side surfaces of the phase change material layer 96, top electrode 98, and hard mask layer 100a before depositing the fourth insulation interlayer film 108 on the upper surface of the hard mask layer 100a. As such, during etching of the fourth insulation interlayer film 108 and the hard mask layer 100a to form the fourth contact hole 110, sidewalls portions of the capping layer 102 may not be contacted by the reactive gas, thereby reducing costs and enhancing reliability of the memory device.

In contrast, if a capping layer formed of a silicon nitride is positioned between the fourth interlayer insulation film 108 and the hard mask layer 100a, respective reactive gases corresponding to an 'ONO' structure may be required via three steps in the etching process to form a contact hole through an insulating layer and a hard mask layer, thus lowering reliability of the etching process. For example, if a capping layer is between the fourth interlayer insulation film and the hard mask layer, the fourth interlayer insulation film may be removed by a first reactive gas, e.g., one or more of $CF_4$, $C_4F_6$ and $C_5F_8$, the capping layer may be removed by a second reactive gas, e.g., $CH_2F_2$, and the hard mask layer may be removed by a third reactive gas, e.g., one or more of $CF_4$, $C_4F_6$ and $C_5F_8$. Thus, the etching process of 'ONO' structure may be divided into three steps including mutually different reactive gases, thereby reducing etching reliability and increasing costs. Further, if a capping layer is between the fourth interlayer insulation film and the hard mask layer, during removal of portions of the capping layer, portions of the phase change material layer 96 may be exposed, e.g., along a boundary of the phase change material layer 96 with the top and/or the capping layer 102.

Accordingly, in a method of manufacturing a PRAM according to an example embodiment, removing an upper portion of the capping layer 102a from the upper surface of the hard mask layer 100a before depositing the fourth insulation interlayer film 108 on the upper surface of the hard mask layer 100a may improve enclosure of the phase change material layer 96 by the capping layer sidewalls portions 102, improve reliability of the PRAM, and reduce manufacturing costs thereof. For example, if an alignment error occurs during formation of the fourth contact hole 110, e.g., when the hard mask layer 100a is entirely removed from the top electrode 98 as illustrated in FIG. 18D, the fourth contact hole 110 may completely overlap the upper surface of the top electrode 98. The fourth contact hole 110, however, may be formed without removing portions of the capping layer 102 due to formation of the capping layer sidewalls portions 102 before deposition of the fourth insulation interlayer film 108. Further, even if the reactive gas used for etching the hard mask layer 100a contacts the capping layer sidewalls portions 102, due to the etch selectivity rate between the material used to form the fourth interlayer insulation film 108 and the hard mask layer 100a and the material of the capping layer 102, no damage may be caused to the capping layer sidewalls portions 102. Therefore, portions of the phase change material layer 96 may not be exposed to the fourth contact hole 110 via the capping layer sidewall portions 102.

Figure 16:
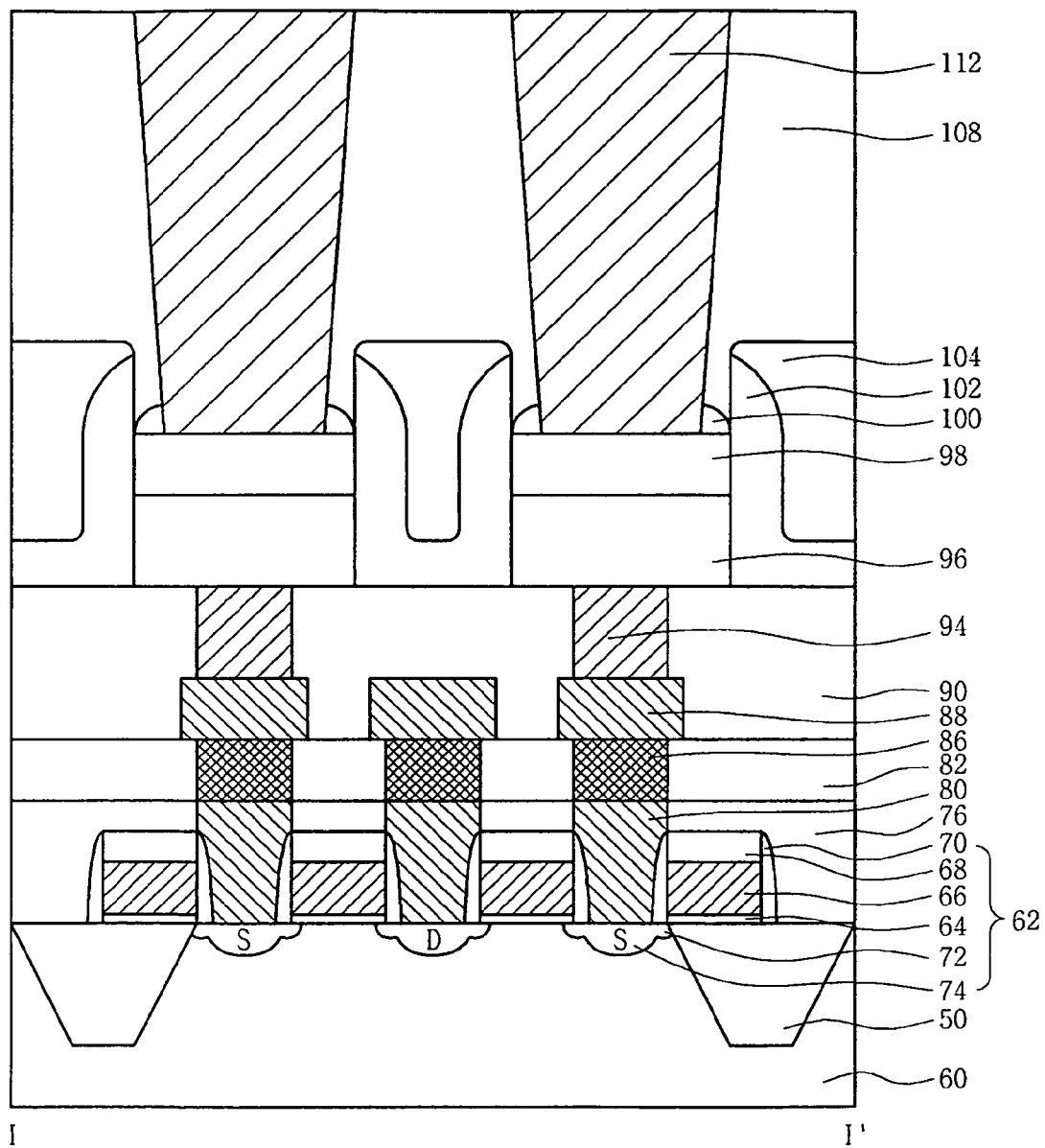

Referring to FIG. 16, the third contact plug 112 electrically connected to the top electrode 98 may be formed in the fourth contact hole 110. The third contact plug 112 may be formed by depositing a conductive metal layer on the fourth interlayer insulation film 108 to fill the fourth contact hole 110 and to cover an upper surface of the fourth interlayer insulation film 108, followed by planarizing the conductive metal layer to expose the upper surface of the fourth interlayer insulation film 108. For example, sidewalls of the third contact plug 112 may be angled, so a lower surface of the contact plug 112 may be smaller than an upper surface of the third contact plug 112. The lower surface of the third contact plug 112, i.e., a contact surface between the top electrode 98 and the third contact plug 112, may be larger than a contact surface between the bottom electrode 94 and the phase change material layer 96. Therefore, the relatively large contact surface between the top electrode 98 and the third contact plug 112 may prevent or substantially minimize loss of current applied to the top electrode 98. The third contact plug 112 may be formed of a substantially same or similar conductive metal as the top electrode 98 through CVD or physical deposition, or may be formed of one or more of polysilicon doped with conductive impurities having a prominent conduction, tungsten silicide, aluminum silicide, tungsten, aluminum, and copper.

Formation of the third contact plug 112 according to an example embodiment, e.g., of tungsten by sputtering, may improve reliability thereof. In contrast, if the third contact plug 112 is formed of tungsten by sputtering according to a conventional method, e.g., if a sidewall of the phase change material layer is exposed during deposition of the tungsten into the fourth contact hole, fumes of the phase change material layer may expand through the exposed portion into the fourth contact hole. Fumes of the phase change material layer in the fourth contact hole may interfere with the tungsten deposition in the fourth contact hole, so the third contact plug may not be formed normally, e.g., include defects.

Therefore, in a method of manufacturing a phase change memory device according to an example embodiment, removal of the upper portion of the capping layer 102 to surround sidewalls of the phase change material layer 96 before formation of the fourth contact hole 110 may prevent exposure of the phase change material layer 96 to the fourth contact hole 110. In other words, the fourth interlayer insulation layer 108 and the hard mask layer 100*a* may be removed regardless of whether the capping layer 102 exists or not, so even when an alignment error occurs, e.g., completely removing the hard mask layer 100*a* or forming the bottom of the fourth contact hole 110 larger than that of the phase change material layer 96 and/or the top electrode 98, capping layer sidewalls portions 102 may prevent exposure of the phase change material layer 96 to the fourth contact hole 110, thereby preventing or substantially minimizing occurrence of a lift error of the third contact plug 112 in the fourth contact hole 110 to increase production yield of the PRAM device.

Figure 17:
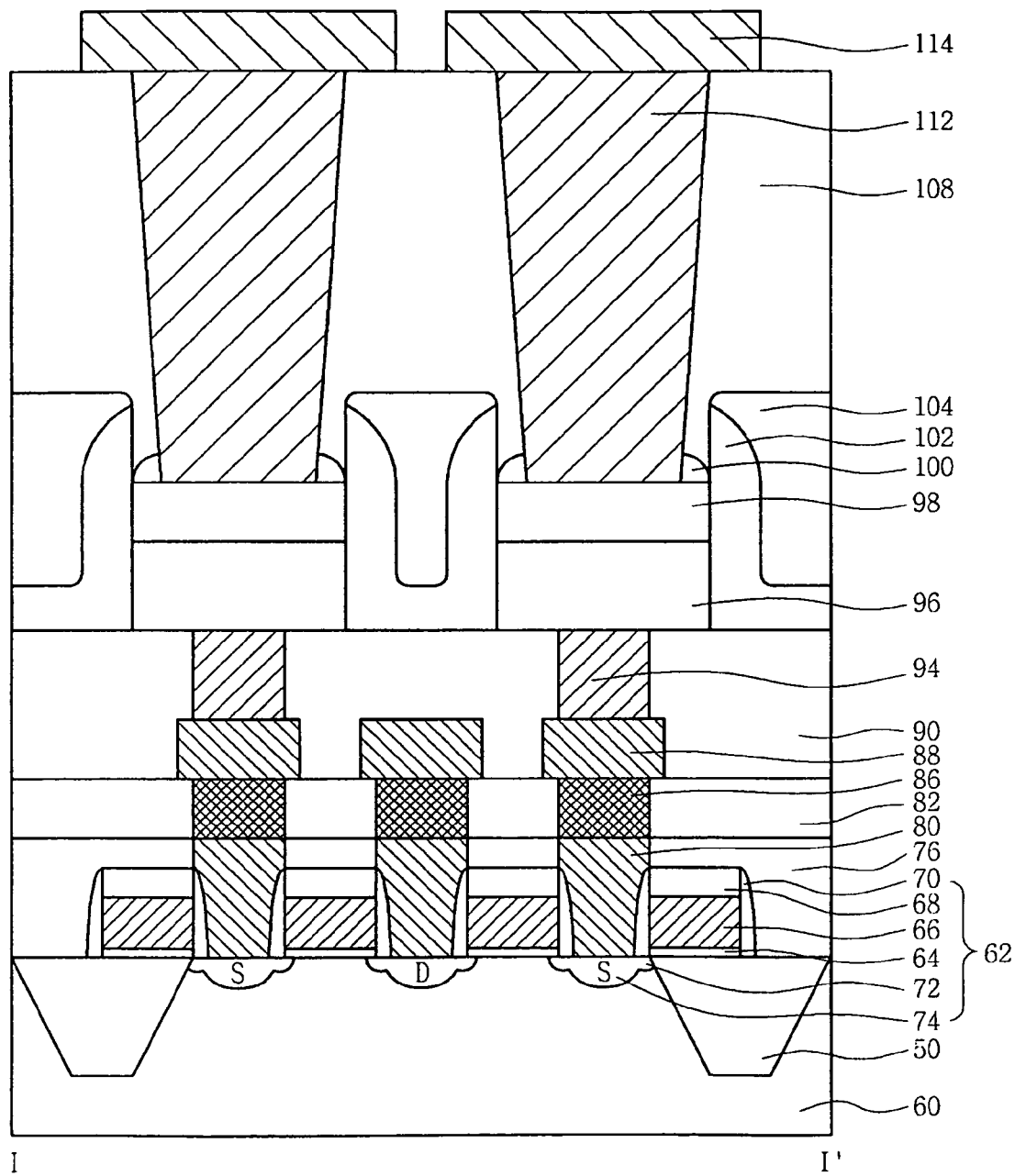

Referring to FIG. 17, a metal line 114 may be formed on the third contact plug 112. The metal line 114 may be formed by depositing a conductive metal layer of a predetermined thickness on an entire surface of the semiconductor substrate 60 and by etching the conductive metal layer through a dry etching process using a patterned photoresist layer as an etching mask so as to cover the third contact plug 112. The metal line 114 may be formed of, e.g., one or more of polysilicon doped with conductive impurities, tungsten silicide, aluminum silicide, tungsten, aluminum and copper.

A method of manufacturing a PRAM according to an example embodiment may include formation of the capping layer 102 to protect the phase change material layer 96, such that an upper portion of the capping layer 102*a* may be first removed from an upper part of the top electrode 98 to form the capping layer sidewall portions of 102 along sidewalls of the phase change material layer 96. Accordingly, when the fourth interlayer insulation film 108 is formed in a subsequent process, the fourth interlayer insulation film 108 may be etched to expose the top electrode 98 regardless of the capping layer 102, e.g., without removing the capping layer 102*a*, to form the fourth contact hole 110, thereby preventing exposure of the phase change material layer 96 to the fourth contact hole 110. Therefore, a lift error of the third contact plug 112 due to exposure of the phase change material layer 96 to the fourth contact hole 110 may be prevented or substantially minimized.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a phase change memory device, comprising:
    forming at least one active device on a substrate;
    forming a bottom electrode electrically connected to the at least one active device;
    forming a phase change material layer and a top electrode on the bottom electrode, the phase change material layer being between the top and bottom electrodes;
    forming a capping layer on an upper surface of the top electrode and on side surfaces of the top electrode and the phase change material layer;
    removing a portion of the capping layer overlapping the upper surface of the top electrode to define capping layer sidewall portions, the capping layer sidewall portions being on side surfaces of the top electrode and the phase change material layer;
    forming an interlayer insulation film on the capping layer sidewall portions and on the top electrode;
    removing a portion of the interlayer insulation film from the top electrode to form a contact hole through the interlayer insulation film, the contact hole exposing the upper surface of the top electrode; and
    forming a contact plug in the contact hole.

2. The method as claimed in claim 1, further comprising forming a hard mask layer on the top electrode, such that the phase change material layer, the top electrode, and the hard mask layer are sequentially stacked on the bottom electrode, the hard mask layer being between the capping layer and the top electrode.

3. The method as claimed in claim 2, wherein forming the interlayer insulation film on the top electrode includes forming the interlayer insulation film directly on the hard mask layer, a surface of contact between the interlayer insulation film and the hard mask layer overlapping the entire upper surface of the top electrode.

4. The method as claimed in claim 2, wherein the phase change material layer and the top electrode are formed through a dry etching method using the hard mask layer as a mask.

5. The method as claimed in claim 2, wherein removing the portion of the capping layer overlapping the upper surface of the top electrode includes:
    forming the capping layer conformally on an entire surface of substrate including the hard mask layer;
    forming a dummy interlayer insulation film on an entire surface of the capping layer, the dummy interlayer insulation film exposing the portion of the capping layer overlapping the upper surface of the top electrode; and
    anisotropically removing the exposed portion of the capping layer to expose an upper surface of the hard mask layer.

6. The method as claimed in claim 5, wherein the dummy interlayer insulation film is planarized using a chemical mechanical polishing (CMP) to expose the portion of the capping layer overlapping the upper surface of the top electrode.

7. The method as claimed in claim 2, wherein removing the portion of the interlayer insulation film from the top electrode further comprises removing a portion of the hard mask layer, the portions of the interlayer insulation film and the hard mask layer being removed in a single step using a substantially same reactive gas.

8. The method as claimed in claim 7, wherein the hard mask layer and the interlayer insulation film are formed of a substantially same material.

9. The method as claimed in claim 7, wherein the hard mask layer and the interlayer insulation film are removed by using one or more of $CF_4$, $C_4F_6$ and $C_5F_8$.

10. The method as claimed in claim 2, wherein the capping layer is formed of a silicon nitride or of a silicon oxynitride by a chemical vapor deposition (CVD) method.

11. The method as claimed in claim 10, wherein the capping layer is removed by a dry etching method using $CH_2F_2$ gas as a source gas.

12. The method as claimed in claim 10, wherein the hard mask layer and the interlayer insulation film are formed of a silicon oxide.

13. The method as claimed in claim 1, wherein removing the portion of the capping layer overlapping the upper surface of the top electrode includes completely removing the portion of the capping layer overlapping the upper surface of the top electrode.

14. The method as claimed in claim 1, wherein removing the portion of the capping layer overlapping the upper surface of the top electrode is performed in a self-aligned manner.

* * * * *